(12) United States Patent
Onizuka et al.

(10) Patent No.: US 8,059,498 B2
(45) Date of Patent: Nov. 15, 2011

(54) OPERATING ELEMENT AND REPRODUCER

(75) Inventors: Kazuhiro Onizuka, Kawasaki (JP); Yasuhiro Endo, Kawasaki (JP); Yuichi Kouno, Kawasaki (JP); Yasuhiro Kiyohara, Kawasaki (JP)

(73) Assignee: D&M Holdings, Inc. (JP)

( * ) Notice: Subject to any disclaimer, the term of this patent is extended or adjusted under 35 U.S.C. 154(b) by 0 days.

(21) Appl. No.: 12/446,207

(22) PCT Filed: Sep. 27, 2007

(86) PCT No.: PCT/JP2007/068746
§ 371 (c)(1),
(2), (4) Date: Sep. 16, 2010

(87) PCT Pub. No.: WO2008/050572
PCT Pub. Date: May 2, 2008

(65) Prior Publication Data
US 2011/0013498 A1     Jan. 20, 2011

(30) Foreign Application Priority Data

Oct. 24, 2006 (JP) ................................ 2006-289042
Mar. 14, 2007 (JP) ................................ 2007-064659

(51) Int. Cl.
*G11B 7/085* (2006.01)
(52) U.S. Cl. ................................ 369/30.04; 369/30.27
(58) Field of Classification Search ............... 369/30.04, 369/30.03, 30.01, 283, 280, 30.27, 30.19, 369/30.26, 47.32, 47.1, 47.28, 53.31
See application file for complete search history.

(56) References Cited

U.S. PATENT DOCUMENTS

| 7,019,540 B2 * | 3/2006 | Yakabe et al. ................. 324/686 |
| 7,075,527 B2 * | 7/2006 | Takagi et al. ................. 345/184 |
| 7,408,854 B2 * | 8/2008 | Usui et al. ................. 369/47.32 |
| 7,489,599 B2 * | 2/2009 | Usui ......................... 369/30.27 |
| 2011/0026380 A1 * | 2/2011 | Onizuka .................... 369/30.03 |

FOREIGN PATENT DOCUMENTS

| JP | 10-240255 A | 9/1998 |
| JP | 2000-18905 A | 1/2000 |
| JP | 2002-352513 A | 12/2002 |
| JP | 2003-185688 A | 7/2003 |
| JP | 2004-86437 A | 3/2004 |
| JP | 2005-190633 A | 7/2005 |

* cited by examiner

*Primary Examiner* — Ali Neyzari
(74) *Attorney, Agent, or Firm* — Peter A. Nieves; Sheehan, Phinney, Bass + Green, PA

(57) ABSTRACT

An operating element for receiving from an operator an instruction about reading speed and reading order of stored data includes: a rotatable operating disc part (38) disposed at one end of a rotation shaft (40), for receiving a rotation operation by an operator; a sensor substrate part (34) through which the rotation shaft (40) is inserted and having a sensor pattern (44) for detecting capacitance disposed on a surface facing the operating disc part (38); and a conductive cover part (36) disposed between the operating disc part (38) and the sensor substrate part (34) so as to cover the sensor pattern (44) and to sag when the operating disc part (38) is pressed, the conductive cover part (36) being set to a ground potential.

10 Claims, 5 Drawing Sheets

OPERATING ELEMENT AND REPRODUCER

TECHNICAL FIELD

The present invention relates to a technology for a reproducing device that can reproduce stored digital data freely.

BACKGROUND ART

A reproducing device, which is used in a disco club or the like by an operator such as a disc jockey, has, as an operating means for performing a cue or a scratch reproduction, a disc-like operating element that can be operated to rotate. This reproducing device detects a rotation direction, a rotation speed, and a rotation variation of the operating element and whether or not the operating element is operated by the operator. Then, it performs a special reproduction according to the detected operation, such as a scratch reproduction (see, for example, Japanese Patent Application Laid-open No. 2002-343026 (in Paragraph "0082" and the like) and Japanese Patent Application Laid-open No. 2005-190633).

In configuration for detecting a pressure applied to the operating element by the operator, a plurality of switches are usually disposed circularly below an outer rim of the operating element (see, for example, Japanese Patent Application Laid-open No. 2005-190633). When the operator operates the operating element, the operating element move downward and presses the switch so that the pressure is detected. As the switch, a mechanical switch or a membrane switch is used.

In addition, Japanese Patent Application Laid-open No. 2002-343026 discloses a structure in which a pressure sensing layer made of a dielectric material is provided to a casing, whereby the pressure sensing layer senses a pressure on an outer rim of the operating element.

Further, Japanese Patent Application Laid-open No. 2002-343026 describes that a capacitance sensor may be used for detecting a variation in capacitance, though it does not disclose any concretization thereof.

However, those conventional pressure detection methods using the operating element have the following disadvantages. First, if the switch is used for the detection, there may be a difference of operational touch feeling between a part where the switch is disposed and a part where the switch is not disposed or a difference of operation feeling due to a difference of a stroke (distance between the operating element and the switch) and a click feeling from each other. In addition, age deterioration due to physical contacts is apt to occur, so that there is a fear that detection accuracy cannot be maintained. Further, the structure including the switch causes an increase in cost for manufacturing, for example, a die.

Next, if the pressure sensing layer is used for the detection, the pressure sensing layer and the operating element always contact with each other via a sheet. As a result, deterioration by friction is outstanding so that there is a problem that detection of high accuracy cannot be maintained. Therefore, it is not practical. In addition, similarly to the case of using the switch, there is a restriction in designing the entire apparatus because the pressure is detected by a positional relationship between the operating element and the casing.

From this viewpoint, it is preferable to apply a capacitance sensor (see, for example, Japanese Patent Application Laid-open No. 11-258090) to the operating element so that the operating element itself can detect the pressure, because the age deterioration due to the physical contacts hardly occur. In addition, flexibility in the designing may increase, and the manufacturing cost is low.

DISCLOSURE OF THE INVENTION

Here, the capacitance sensor is usually used for a switch for controlling turning on and off a light fixture, or the like, and it is not required to have such high accuracy of the pressure detection. However, the reproducing device used by a disc jockey or the like perform in real time and by each beat, for example, processings such as switching audio processing and stopping the audio in accordance with whether or not the operating element is pressed. Therefore, the pressure detection means used for the operating element of the reproducing device is required to have high accuracy of the pressure detection.

However, if the capacitance sensor is simply applied to the operating element, a detection error may occur due to an influence of fluctuation in capacitance when a person approaches, external noise, and the like. Japanese Patent Application Laid-open No. 2002-343026 does not disclose anything about this problem that occurs when the capacitance detection is performed. As described above, it is conventionally required to make practicable an operating element that can detect a variation in capacitance so as to detect a pressure applied on the operating element by the operator and a reproducing device provided with the operating element. It is an object of the present invention to solve the problems in the conventional technologies described above.

In order to attain the above-mentioned object, an operating element according to a first aspect of the present invention is an operation element for receiving from an operator an instruction about reading speed and reading order for reading data stored in a memory, and includes: a rotatable operating disc part provided to one end of a rotation shaft, for receiving a rotation operation by an operator; a sensor substrate part through which the rotation shaft is inserted and having a sensor pattern for detecting capacitance provided to a surface facing the operating disc part; and a conductive cover part provided between the operating disc part and the sensor substrate part so as to cover the sensor pattern and to sag when the operating disc part is pressed, the conductive cover part being set to be a ground potential.

The operating element having the above-mentioned structure includes a sensor chip for outputting, when a value of capacitance between the conductive cover part and the sensor pattern decreases to be lower than a predetermined threshold value, a signal indicating the decrease.

In the above-mentioned structure, four of the sensor patterns are preferably provided at the same interval from each other. In this case, the sensor patterns are preferably disposed in shapes of concentrically-provided fans having a central angle of 70 degrees and at an interval of 10 degrees from each other.

In the above-mentioned structure, a distance between the conductive cover part and the sensor pattern is preferably 0.5 mm.

The operating element having the above-mentioned structure may further include a mat part, which includes a plurality of sheets and provided between the operating disc part and the conductive cover part.

In order to attain the above-mentioned object, a reproducing device according to a second aspect of the present invention is a reproducing device including an operating part for receiving an instruction about reading speed and reading order of data stored in a memory from an operator via an operating element, and a control part for performing reading control of the data stored in the memory on the basis of the instruction received by the operating part, in which the operating element includes: a rotatable operating disc part provided to one end of a rotation shaft, for receiving a rotation operation by the operator; a sensor substrate part through which the rotation shaft is inserted and having a sensor pattern for detecting capacitance provided on the surface facing the operating disc part; and a conductive cover part provided between the operating disc part and the sensor substrate part so as to cover the sensor pattern and to sag when the operating disc part is pressed, the conductive cover part being set to be a ground potential.

In the above-mentioned structure, the control part determines that the operating element is pressed when a value of capacitance between the sensor pattern and the conductive cover part that sags due to a pressing operation of the operating disc part by the operator decreases to be lower than a predetermined threshold value.

The reproducing device having the above-mentioned structure includes a sensor chip for outputting, when a value of capacitance between the conductive cover part and the sensor pattern decreases to be lower than a predetermined threshold value, a signal indicating the decrease.

In the above-mentioned structure, four of the sensor patterns are preferably provided at the same interval from each other. In this case, the sensor patterns are preferably disposed in shapes of concentrically-provided fans having a central angle of 70 degrees and at an interval of 10 degrees from each other.

In the above-mentioned structure, a distance between the conductive cover part and the sensor pattern is preferably 0.5 mm. The reproducing device having the above-mentioned structure may further include a mat part, which includes a plurality of sheets and provided between the operating disc part and the conductive cover part.

BEST MODE FOR CARRYING OUT THE INVENTION

Hereinafter, an embodiment of the present invention is described in detail with reference to the drawings. In the embodiment described below, a reproducing device that can perform a special reproduction such as scratch reproduction of digital audio data recorded on a transportable or external recording medium is exemplified. Note that the embodiment described below is merely an example and should not be interpreted as a limitation.

Figure 1:
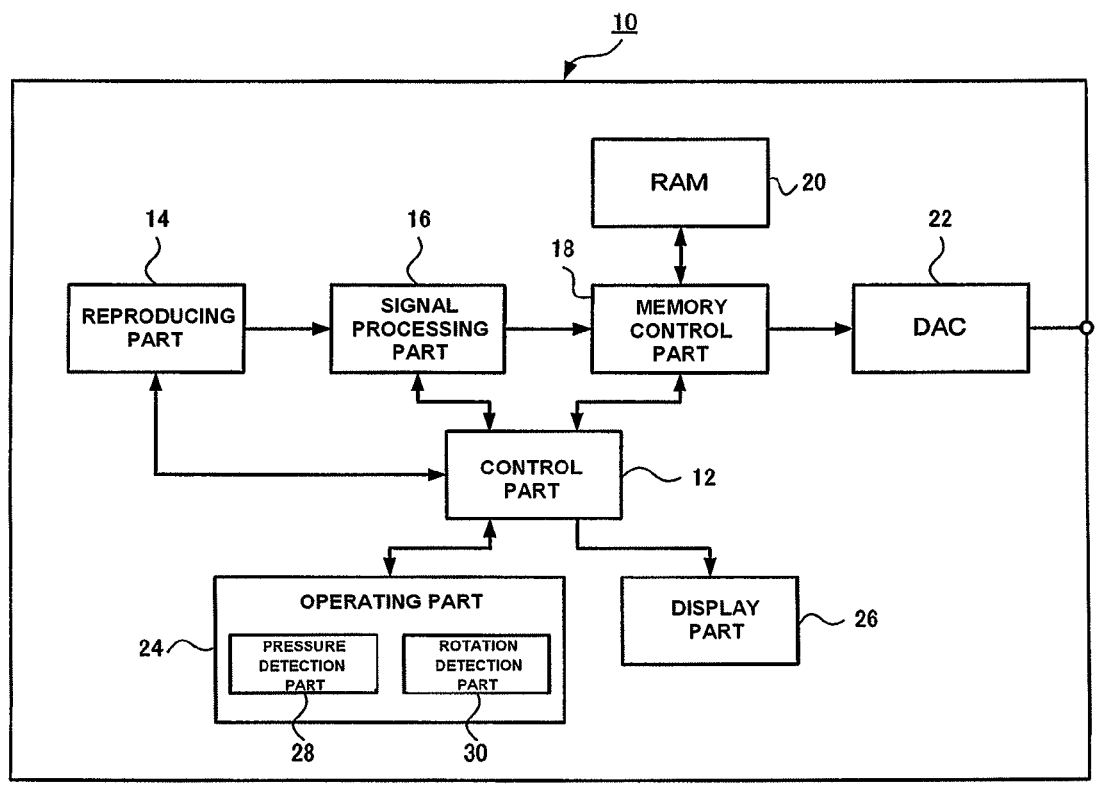
FIG. 1 is a block diagram illustrating a structure of a reproducing device according to an embodiment of the present invention.

FIG. 1 illustrates a structure of a reproducing device 10 according to the embodiment of the present invention. The reproducing device 10 illustrated in FIG. 1 includes a control part 12, a reproducing part 14, a signal processing part 16, a memory control part 18, a random access memory (RAM) 20, a digital to analog converter (DAC) 22, an operating part 24, and a display part 26.

The control part 12 generally controls an operation of the reproducing device 10 described below in detail.

The reproducing part 14 reproduces compressed and/or uncompressed digital audio data recorded on the transportable or external recording medium. As the recording medium, there are a compact disc (CD), a digital versatile disc (DVD), an external memory that can be connected externally, and the like. The reproducing part 14 reproduces compressed digital audio data recorded on a recording medium in a unit of track and converts it into a predetermined format so as to deliver the same.

The digital audio data reproduced by the reproducing part 14 is supplied to the signal processing part 16. The signal processing part 16 performs processes of demodulating the digital audio data, extracting a sync signal, and the like, so as to deliver the digital audio data to the memory control part 18.

The memory control part 18 controls to write the supplied digital audio data in the RAM 20. The RAM 20 stores the supplied digital audio data. In addition, the memory control part 18 controls to read from the RAM 20 the digital audio data stored in the RAM 20.

The data read from the RAM 20 is delivered to the DAC 22. The DAC 22 converts the digital audio data into an analog audio signal. The analog audio signal converted by the DAC 22 is delivered from an output terminal. If the data is delivered to the device capable of digital input, a predetermined digital format may be used for the output without using the DAC 22.

The display part 26 is constituted by a liquid crystal display device or the like and displays playback time, a track number, and the like of the current track.

Figure 2:
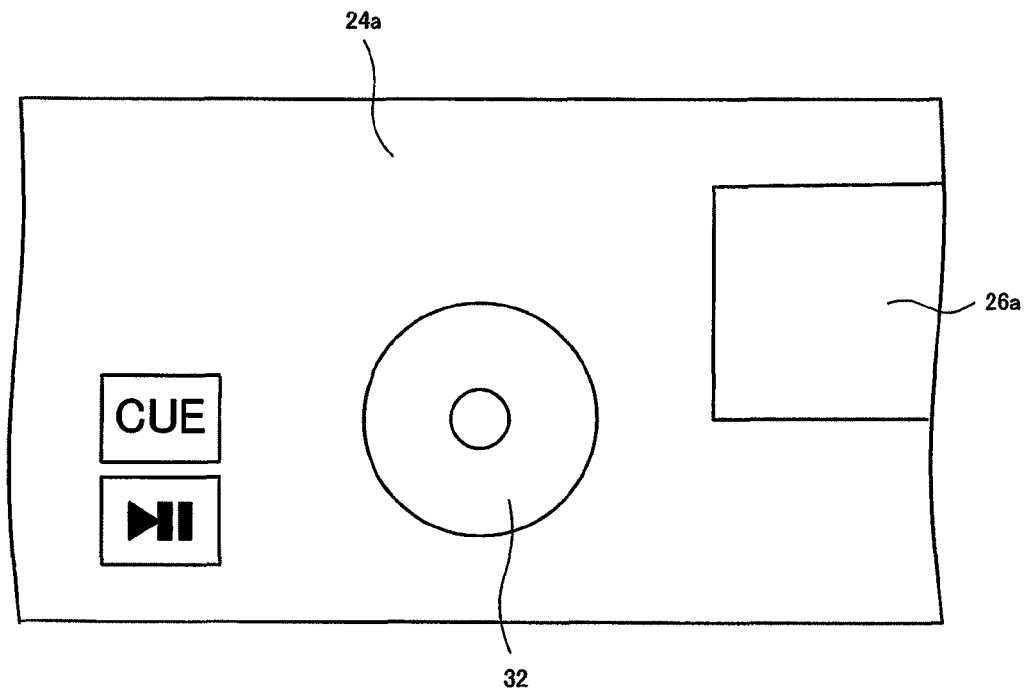
FIG. 2 is a diagram illustrating an example of an operating panel according to the embodiment of the present invention.

The operating part 24 accepts a command about reproduction control from an operating panel 24a having a play button, a stop button, and the like as illustrated in FIG. 2, for example. In addition, the operating part 24 accepts a command for scratch reproduction or the like from an operating element 32 described later. The operating part 24 includes a pressure detection part 28 for detecting whether or not the operating element 32 is pressed by the operator, and a rotation detection part 30 for detecting a rotation operation state of the operating element 32. For instance, the illustrated operating panel 24a includes the operating element 32, and a display 26a constituting the display part 26. The operator operates the operating element 32 and the like while viewing the display 26a.

Figure 3:
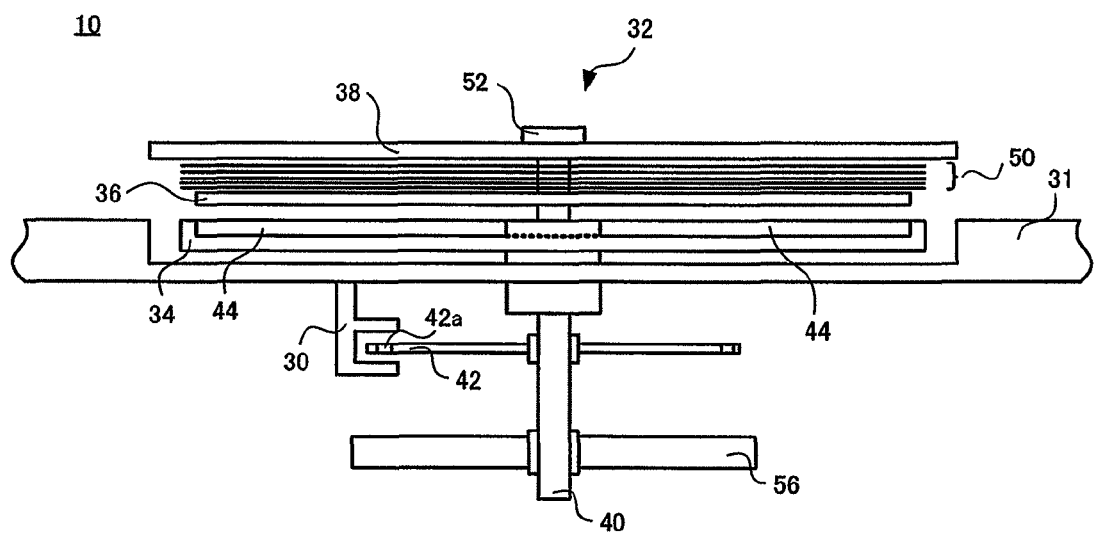
FIG. 3 is a diagram illustrating a top view of a sensor substrate part according to the embodiment of the present invention.

FIG. 3 illustrates a cross sectional side view of the reproducing device 10 according to this embodiment. The reproducing device 10 illustrated in FIG. 3 has a structure in which the operating element 32 is disposed at substantially the middle of an upper surface constituting an operating panel 26 and the like of a casing 31. The casing 31 is made of a plastic material, for example, which constitutes a rectangular solid appearance, for example. The operating element 32 includes a sensor substrate part 34, a conductive cover part 36, an operating disc part 38, a rotation shaft 40, and a slit sheet part 42.

The sensor substrate part 34 is constituted by an annular disc-like member fixed onto a recess disposed at substantially the middle of the casing 31. The sensor substrate part 34 is constituted by, e.g., low cost paper phenol, glass epoxy base material, copper foil patterns, or the like.

Figure 4:
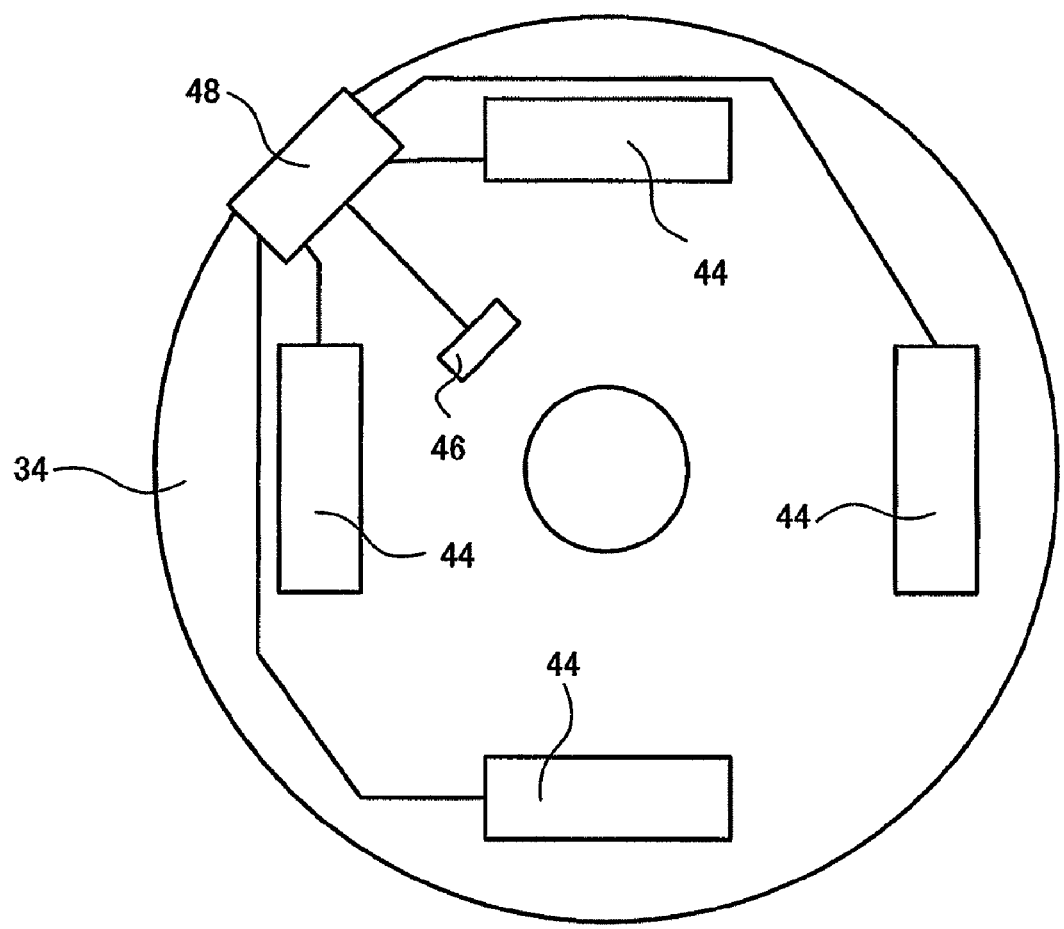
FIG. 4 is a diagram illustrating the top view of the sensor substrate part according to the embodiment of the present invention.

FIG. 4 illustrates a top view of the sensor substrate part 34. As illustrated in FIG. 4, sensor patterns 44 for detecting capacitance, a ground pattern 46, and a sensor chip 48 are disposed on the top surface of the sensor substrate part 34. The sensor patterns 44 are made of copper foils, for example. In this example, four sensor patterns 44 having a rectangular shape are disposed substantially at constant intervals, but the number of the sensor patterns 44 is not limited to four. One ground pattern 46 is disposed and is connected to the ground. The sensor chip 48 is electrically connected to the sensor patterns 44 and the ground pattern 46. The sensor chip 48, the sensor patterns 44, and the ground pattern 46 constitute the pressure detection part 28 in this example, which delivers a signal indicating that the operating element 32 is pressed in accordance with a variation of capacitance as described later.

Figure 5:
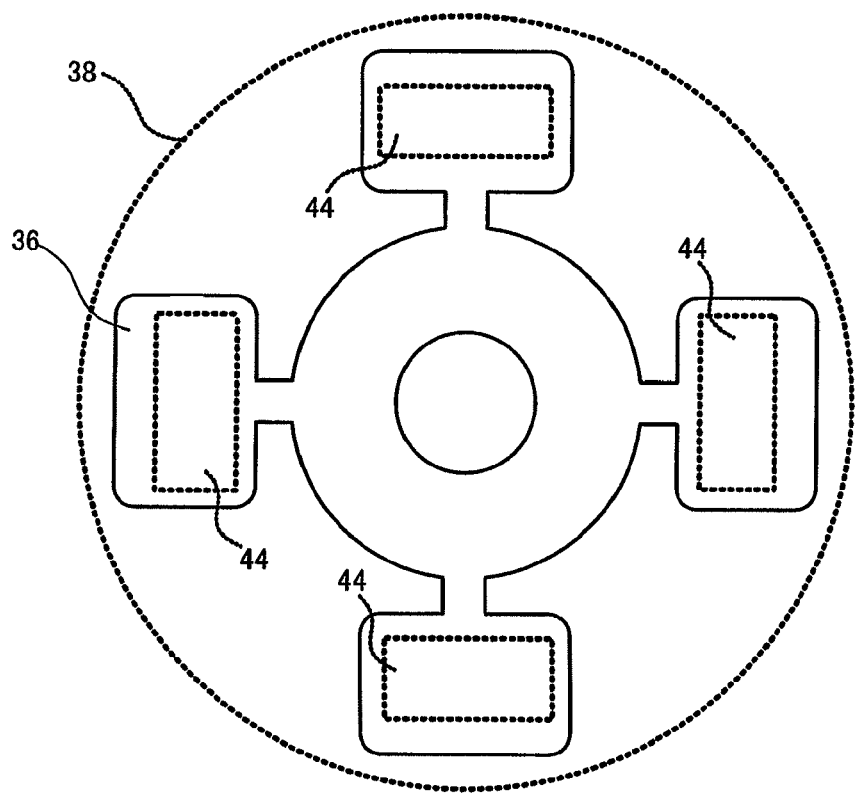
FIG. 5 is a diagram illustrating a conductive cover part according to the embodiment of the present invention.

With reference to FIG. 3 again, the conductive cover part 36 is made of a conductive material such as phosphor bronze. The conductive cover part 36 is constituted by a thin plate member that is formed so as to cover at least the sensor patterns 44 disposed on the sensor substrate part 34. FIG. 5 illustrates a top view of the conductive cover part 36. As illustrated in FIG. 5, the conductive cover part 36 of this example includes four wide parts having a width that is the same as or larger than that of the rectangular sensor patterns 44. Those wide parts are connected to a center ring-like part. Therefore, the entire conductive cover part 36 has the same potential. The conductive cover part 36 is electrically connected to the ground pattern 46 so as to be the ground potential.

With reference to FIG. 3 again, the sensor substrate part 34 and the conductive cover part 36 are engaged with each other and are fixed to the casing 31. In the state where the sensor substrate part 34 and the conductive cover part 36 are engaged, the conductive cover part 36 is supported above the sensor patterns 44 of the sensor substrate part 34 so as to cover the sensor patterns with a space. The space between each of the sensor patterns 44 and the conductive cover part 36 is set to be 0.5 mm, for example. The conductive cover part 36 is adapted to be flexible so that it can sag by approximately 0.3 mm, for example, toward the pressure from the top.

The sensor chip 48 detects a capacitance value varying in accordance with a distance between the conductive cover part 36 and each of the sensor patterns 44. Each of the sensor patterns 44 has a sensor surface covered with the conductive cover part 36 at the ground potential. Therefore, each of the sensor patterns 44 is in the state being shielded by the conductive cover part 36. Even if a hand of the operator or other object having a potential close to the ground approaches, the detected capacitance value is not fluctuated. On the other hand, if the conductive cover sags due to the pressure from the top, the distance between the conductive cover part 36 and each of the sensor patterns 44 decreases so that the detected capacitance varies.

The sensor chip 48 detects capacitance formed between each of the sensor patterns 44 and the conductive cover part 36 and delivers a corresponding signal to the control part 12 when the capacitance value decreases to be lower than a predetermined threshold value. When the control part 12 receives the signal from the sensor chip 48, it determines that the operating disc part 38 described later has been pressed. The sensor chip 48 determines as a threshold value a capacitance value when the distance between the conductive cover part 36 and each of the sensor patterns 44 is approximately 0.3 mm, for example. Note that the sensor chip 48 may not be disposed on the same sensor substrate part 34 of the sensor patterns 44 and may be disposed freely.

The operating disc part 38 is disposed on the conductive cover part 36 and is constituted by an annular disc-like member made of a plastic material such as polycarbonate. For instance, the operating disc part 38 has a diameter of 5 to 30 cm, e.g., an outer diameter of 7 cm and a thickness of 0.5 to 2.0 cm, e.g., 0.8 mm. Sizes of the sensor substrate part and the conductive cover part 36 are set based on the size of the operating disc part 38 so as to have a smaller diameter than that of the same.

A mat part 50 is disposed between the operating disc part 38 and the conductive cover part 36. The mat part 50 has an outer diameter that is substantially the same as that of the operating disc part 38 and is preferably made of a plastic material (e.g., nylon, polyethylene terephthalate (PET) having a small friction coefficient, or the like so as to generate little static electricity. The operating disc part 38 rotates over the mat part 50. Here, if the operating disc part 38 is made of a material that can rotate on the sensor substrate part 34 smoothly with little static electricity, the mat part 50 is needless. In this case, it is preferable to dispose the conductive cover part 36 so as to cover the entire top surface of the sensor substrate part 34.

In this example, the mat part 50 is constituted by a plurality of, e.g., five laminated plastic sheets. The sheets may not be made of the same material. For instance, a sheet made of PET may be disposed at the middle, and a plurality of sheets made of nylon may be laminated on both sides thereof. If the mat part 50 is constituted by the plurality of laminated sheets in this way, smoothness of the operating disc part 38 can be improved, and the operator can be given a preferable operation feeling (press feeling).

The rotation shaft 40 is disposed so as to pass through the sensor substrate part 34, the conductive cover part 36, and the operating disc part 38 at substantially the center. An end of the rotation shaft 40 is fixed to a holding part 52 with a screw on the top surface of the operating disc part 38. Therefore, the operating disc part 38 is not detached from the rotation shaft 40 and can rotate over the sensor substrate part 34 via the mat part 50.

In addition, the other end of the rotation shaft 40 is provided with a weight 56. The weight 56 is constituted by an iron disc having a weight of 33.5 grams and a diameter of 5 cm. When the operating disc part 38 is rotated by the operator, the weight 56 is also rotated similarly so as to give an inertial force to the rotation of the operating disc part 38. Here, the operating disc part 38 is required to have sufficient rotation performance, for which the smoothness of the mat part 50 and a bias force of the weight 56 are important factors.

The operating disc part 38 and the mat part 50 correspond respectively to an analog record disc and a slip mat in an analog record player. The operator, e.g., the disc jockey operates the operating disc part 38 to rotate in an operation feeling similar that in an analog record player, and can perform the scratch reproduction and the like.

When the operator presses the operating disc part 38 downward for operation, the mat part 50 and the conductive cover part 36 under the operating disc part 38 sags due to the pressure. On this occasion, if a value of the capacitance formed between the sagged conductive cover part 36 and the sensor patterns 44 decreases to be smaller than a predetermined threshold value, the pressure detection part 28 (sensor chip 48) delivers a corresponding signal to the control part 12. When the control part 12 receives the signal, it determines that the operating disc part 38 is pressed and operated by the operator.

The slit sheet part 42 is constituted by a disc-like member made of a plastic material or the like. The slit sheet part 42 is penetrated with the rotation shaft 40 at substantially the middle thereof and is fixed to the rotation shaft 40 with a screw (not shown). The operating disc part 38 and the slit sheet part 42 rotate as one unit via the rotation shaft 40. The slit sheet part 42 is disposed on the inner side of the casing 31. Therefore, if the operating disc part 38 exposed on the top surface of the casing 31 is operated to rotate, the slit sheet part 42 rotates in the direction and at the rotation speed corresponding to the rotation of the operating disc part 38 inside the casing 31. A slit part 42a is disposed at an outer circumferential part of the slit sheet part 42. The slit part 42a is constituted by, e.g., a rectangular opening part or formed by printing a printing ink including carbon.

At the vicinity of the outer circumferential part of the slit sheet part 42, the rotation detection part 30 for detecting the rotation speed and the rotation direction of the slit sheet part 42 is provided to the casing 31. The rotation detection part 30 includes two optical sensors (not shown) that are disposed at positions for detecting a movement of the slit part 42a of the rotating slit sheet part 42. When the rotation detection part 30 detects the slit part 42a, it generates pulse signals having different phases (having a phase difference of 90 degrees, for example) from the two optical sensors and delivers them to the control part 12.

The control part 12 determines the rotation direction of the operating disc part 38 based on a phase difference between the supplied two-phase pulse signals. In addition, the control part 12 discriminates the rotation speed of the operating disc part 38 from the number of pulses of the pulse signal supplied during a unit time.

Though the optical sensor (photointerrupter) is used for the rotation detection part 30 in this example, it is possible to use other rotation detection part such as a rotary encoder for detecting the rotation state (the rotation direction and the rotation speed) of the operating disc part 38.

As described above, the control part 12 receives the signal indicating that pressing of the operating disc part 38 has been detected (hereinafter referred to as pressure detection signal) from the pressure detection part 28. It also receives the signal about the rotation state of the operating disc part 38 (hereinafter referred to as rotation state signal) from the rotation detection part 30. The control part 12 controls reproduction of the audio signal based on the received pressure detection signal and the received rotation state signal as follows, for example.

(Normal Reproduction)

The control part 12 reproduces the audio data recorded on the recording medium with a normal speed and order when none of the rotation state signal and the pressure detection signal is supplied.

(Scratch Reproduction)

When both the rotation state signal and the pressure detection signal are supplied, the control part 12 controls the memory control part 18 so as to read digital audio data from the RAM 20 at a reading speed and in a reading order corresponding to the discriminated rotation speed and rotation direction of the operating disc part 38. The memory control part 18 controls the reading speed and the reading order (the audio data is read in the ascending order or the descending address) of the digital audio data stored in the RAM 20. For instance, when the operating disc part 38 is operated to rotate in a clockwise direction, the control part 12 controls so as to read the digital audio data stored in the RAM 20 at the reading speed corresponding to the rotation speed thereof in an ascending address order. In addition, when the operating disc part 38 is operated to rotate in a counterclockwise direction, the control part 12 controls so as to read the digital audio data stored in the RAM 20 at the reading speed corresponding to the rotation speed thereof in a descending address order.

In order to perform the scratch reproduction, the operator presses the operating disc part 38 by hand and rotates the same quickly in the clockwise direction or in the counterclockwise direction when the normal reproduction is performed. When the analog record player is used for performing the scratch reproduction, the operator usually performs rotating operation of the analog record while pressing the same so that the analog record is rotated against the rotation of the turntable. Therefore, if the operator operates the operating disc part 38 with an operation feeling similar to that of the analog record, the operating disc part 38 is rotated while it is pressed downward.

If the operator performs rotating operation of the operating disc part 38 while pressing the same, the operating disc part 38 and the conductive cover part 36 sags downward due to the pressure. When the conductive cover part 36 sags so that the capacitance decreases to be smaller than a predetermined value, the pressure detection part 28 generates the pressure detection signal and delivers the same to the control part 12. In addition, when the rotation detection part 30 detects the rotating slit part 42a, it generates a rotation state signal (above-mentioned pulse signal) and delivers the same to the control part 12. Therefore, when the operator performs the rotating operation of the operating disc part 38 while pressing the same, the rotation state signal and the pressure detection signal are delivered to the control part 12.

When both the rotation state signal and the pressure detection signal are supplied, the control part 12 controls the memory control part 18 so as to read the digital audio data from the RAM 20 at a reading speed and in a reading order corresponding to the rotation speed and rotation direction, which is discriminated based on the rotation state signal, of the operating disc part 38.

If the operator releases hand from the operating disc part 38 and finishes the scratch reproduction, the operating disc part 38 and the conductive cover part 36 returns to a state before the pressing operation by its resiliency. When the detected capacitance value increases to exceed the threshold value, the pressure detection part 28 stops the output of the pressure detection signal to the control part 12. Even if the rotation state signal is supplied from the rotation detection part 30, the control part 12 makes the memory control part 18 control the RAM 20 to read the digital audio data at the reading speed at the normal reproduction when the input of the pressure detection signal from the pressure detection part 28 is stopped. In other words, the control part 12 performs control for reading the digital audio data from the RAM 20 based on the rotation state signal if both the rotation state signal and the pressure detection signal are supplied, and it performs control for reading the digital audio data from the RAM 20 at the reading speed at the normal reproduction if the input of the pressure detection signal is stopped while only the rotation state signal is supplied. Therefore, even if the rotation state signal generated during the rotation of the operating disc part 38 by its inertia is supplied to the control part 12, the control part 12 can return to the normal reproduction from the scratch reproduction when the input of the pressure detection signal is stopped.

As described above, the operating element 32 according to the above-mentioned embodiment has the pressure detection part 28 for detecting the pressuring operation of the operating element 32 by the operator based on a variation in capacitance. Here, the capacitance sensor patterns 44 constituting the pressure detection part 28 are covered with the conductive cover part 36 that is set to be the ground potential.

Therefore, it is possible to detect only the variation in the capacitance between the conductive cover part 36 and the sensor patterns 44 without being affected by the capacitance value between the operator and the sensor patterns 44. In other words, the sensor patterns 44 are shielded by the conductive cover part 36. Therefore, even if a hand of the operator or other object close to the grounding wire approaches the sensor, the capacitance does not change until the operating disc part 38 is actually pressed so that a minute physical change occurs. Therefore, a detection error when the pressing operation is not performed can be substantially avoided.

In addition, because there is adopted a structure in which the pressure on the operating element 32 is detected from the capacitance change, a problem such as age deterioration due to physical contacts can be substantially avoided or relieved unlike the structure in which a switch is used for detecting the pressure. In addition, a difference of operation feeling depending on a location of the switch or a difference of click feeling does not occur. Further, because the pressure detection part can be disposed inside the operating element 32, restriction to the general design of the reproducing device 10 is decreased, cost of a die or the like can be reduced, and repair such as exchange of the sensor can be facilitated.

As described above, according to the above-mentioned embodiment, it is possible to provide the operating element 32 and the reproducing device that can substantially improve the operability by using the capacitance sensor for detecting the pressure on the operating element 32 while eliminating influence on the capacitance from approaching of human body or external noise, to thereby detect only the pressing operation by the operator.

The present invention is not limited to the embodiment described above, and can be modified or corrected variously.

For instance, in the embodiment described above, although the reproducing device 10 has a structure in which the reproducing part 14 for reproducing data recorded in the recording medium is provided, it may not have the reproducing part 14 but) may process data supplied from an external reproducing means.

In addition, although the above-mentioned embodiment exemplifies the case where only the audio data is reproduced. However, it is also possible to reproduce audio data and video data without limiting to the structure of the embodiment.

EXAMPLE

Hereinafter, an example of the sensor patterns 44 and the conductive cover part 36 in this embodiment is described.

It is necessary that the operating element 32 receives pressures of the operator in four directions, i.e., up, down, left, and right (e.g., up, down, left, and right directions of the operating element 32 in FIG. 2) and detects the same. For instance, the display 26a displays options to be selected that is divided into a plurality of layers, and the operator selects items in different layers with the left and right directions of the operating element 32 and selects items in the same layer with the up and down directions of the same. The detections in the individual directions are required not to interfere with each other. Therefore, it is preferable to dispose one sensor pattern 44 in each of the up, down, left, and right directions for the operator. A screw fixing part for fixing the sensor substrate part 34 can be disposed between the sensor patterns 44.

On the other hand, the operating element 32 is also required to be capable of detecting the pressure in 360 degrees directions (all directions) during the reproduction. For this reason, if one sensor pattern 44 is disposed in each of the up, down, left and right directions as illustrated in FIG. 4, it is critical to secure pressure detection sensitivity in a 45 degrees direction, i.e., in the direction in which the sensor pattern 44 is not disposed.

Further, the larger the distance between the sensor pattern 44 and the conductive cover part 44, the easier the sufficient variation in capacitance can be secured for the detection. However, because an operation amount in the up and down direction and operational torque at the pressing are increased, the operation feeling may be deteriorated. Therefore, the distance between the sensor pattern 44 and the conductive cover part 44 is required to be a distance by which the operation feeling may not be deteriorated and the capacitance variation necessary for the pressure detection can be secured. According to a result of investigation by inventors of the present invention, it was found that an optimal distance between the sensor pattern 44 and the conductive cover part is approximately 0.5 mm. In this example, a structure example that satisfies the above-mentioned requirements concerning the operating element 32 in this distance is described.

Figure 6:
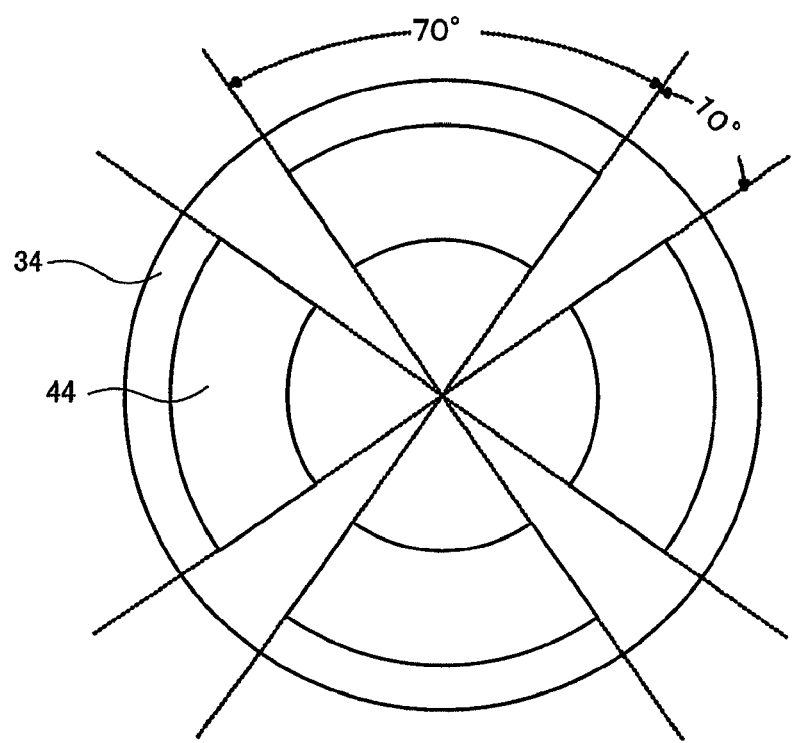
FIG. 6 is a diagram illustrating the top view of the sensor substrate part according to an example.

FIG. 6 illustrates a structure example of the sensor pattern 44 according to this example. In the illustrated example, each of the sensor patterns 44 is formed in a fan-like shape, and is disposed in the up, down, left, and right directions of the figure concentrically. The sensor patterns 44 are disposed preferably in a width of 70 degrees with respect to the center so as to have an interval of 10 degrees from each other. Since the sensor patterns 44 are disposed in this way, the pressure on the operating element 32 in the up, down, left, and right directions can be detected reliably.

Figure 7:
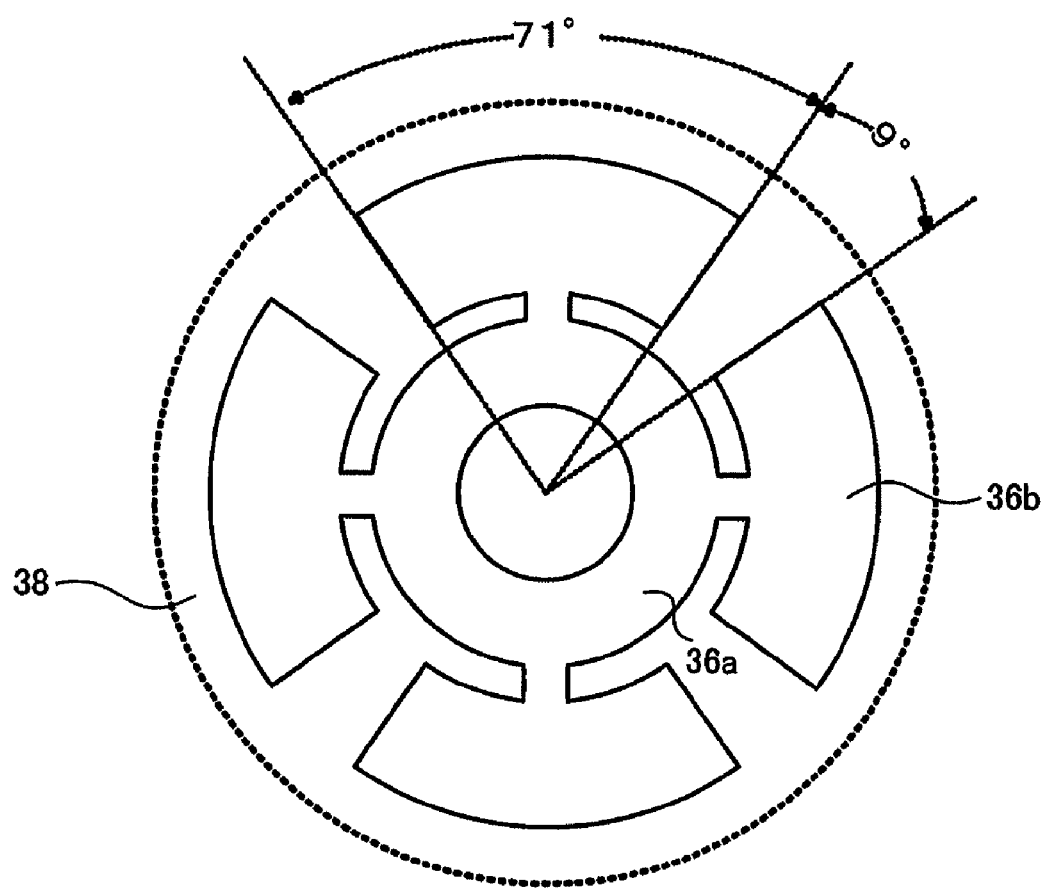
FIG. 7 is a diagram illustrating the conductive cover part according to an example.

FIG. 7 illustrates a structure example of the conductive cover part 36 according to this example. In the illustrated example, the conductive cover part 36 has a ring-like middle part 36a and fan-like wide parts 36b. The four wide parts 36b are connected to the middle part 36a in the up, down, left, and right directions. The wide parts 36b are formed so as to cover each of the sensor patterns 44 by the same area or preferably a little larger area. The wide parts 36b are provided preferably in a width of approximately 71 degrees with respect to the center so as to have an interval of approximately 9 degrees from each other.

If the sensor pattern 44 and the conductive cover part 36 are structured as described above, it is possible to perform the pressure detection in four directions without interference with each other as all direction detection while securing good operation feeling in the case where the space therebetween is set to be approximately 0.5 mm. In other words, by disposing the sensor patterns 44 with an interval of approximately 10 degrees from each other with respect to the center, the pressure in the up, down, left, and right directions can be detected without interference with each other. In addition, the pressure can be detected even in the direction of 45 degrees that is middle direction therebetween.

In this structure, according to a result of verification about the detection sensitivity performed by the inventors of the present invention, the sensitivity in the 45 degrees was approximately "7" when the sensitivity in the up, down, left, and right directions (0 degree) is regarded as "10". In addition, the weight necessary for the detection is set to a value within the range of approximately 50 to 100 grams, so that moderate operation feeling can be realized.

The above description is merely examples of the present invention. It should be easily understood for a person of ordinary skill in the art that the exemplified embodiment can be modified variously without deviating from the novel disclosure and merits of the present invention. Therefore, it should be interpreted that such the modifications are all included in the scope of the present invention.

Japanese Patent Application No. 2006-289042 (filed on Oct. 24, 2006) and Japanese Patent Application No. 2007-64659 (filed on Mar. 14, 2007), including specifications, claims, drawings, and abstracts, are entirely incorporated by reference into this application.

INDUSTRIAL APPLICABILITY

According to the present invention, it is possible to provide the operating element and the reproducing device having the same, which can detect a capacitance variation so as to detect the pressure applied to the operating element by the operator with high accuracy, and hence it has very wide industrial availability.

The invention claimed is:

1. An operating element for receiving from an operator an instruction about reading speed and reading order for reading data stored in a memory, comprising:
 a rotatable operating disc part provided to one end of a rotation shaft, for receiving a rotation operation by an operator;
 a sensor substrate part through which the rotation shaft is inserted and having a sensor pattern for detecting capacitance provided to a surface facing the operating disc part; and
 a conductive cover part provided between the operating disc part and the sensor substrate part so as to cover the sensor pattern and to sag when the operating disc part is pressed, the conductive cover part being set to be a ground potential.

2. The operating element according to claim 1, comprising a sensor chip for outputting, when a value of capacitance between the conductive cover part and the sensor pattern decreases to be lower than a predetermined threshold value, a signal indicating the decrease.

3. The operating element according to claim 1, wherein four of the sensor patterns are provided at the same interval from each other.

4. The operating element according to claim 1, wherein a distance between the conductive cover part and the sensor pattern is 0.5 mm.

5. The operating element according to claim 1, further comprising a mat part, which includes a plurality of sheets and provided between the operating disc part and the conductive cover part.

6. A reproducing device comprising an operating part for receiving an instruction about reading speed and reading order of data stored in a memory from an operator via an operating element, and a control part for performing reading control of the data stored in the memory on the basis of the instruction received by the operating part, wherein
 the operating element comprises:
 a rotatable operating disc part provided to one end of a rotation shaft, for receiving a rotation operation by the operator;
 a sensor substrate part through which the rotation shaft is inserted and having a sensor pattern for detecting capacitance provided on the surface facing the operating disc part; and
 a conductive cover part provided between the operating disc part and the sensor substrate part so as to cover the sensor pattern and to sag when the operating disc part is pressed, the conductive cover part being set to be a ground potential.

7. The reproducing device according to claim 6, wherein the control part determines that the operating element is pressed when a value of capacitance between the sensor pattern and the conductive cover part that sags due to a pressure applied to the operating disc part by the operator decreases to be lower than a predetermined threshold value.

8. The reproducing device according to claim 6, wherein four of the sensor patterns are provided at the same interval from each other.

9. The reproducing device according to claim 6, wherein a distance between the conductive cover part and the sensor pattern is 0.5 mm.

10. The reproducing device according to claim 6, further comprising a mat part, which includes a plurality of sheets and provided between the operating disc part and the conductive cover part.

* * * * *